US007083426B2

(12) United States Patent
Dragov et al.

(10) Patent No.: US 7,083,426 B2
(45) Date of Patent: Aug. 1, 2006

(54) CARRIER FOR PRODUCTION OF CABLE HARNESSES

(76) Inventors: Nikola Dragov, Donaustrasse 97/1, A-2344 Maria Enzersdorf (AT); Uwe Schindler, Eichenweg 22, D-22941 Bargteheide (AT)

( * ) Notice: Subject to any disclaimer, the term of this patent is extended or adjusted under 35 U.S.C. 154(b) by 163 days.

(21) Appl. No.: 10/184,177

(22) Filed: Jun. 27, 2002 (Under 37 CFR 1.47)

(65) Prior Publication Data

US 2003/0134524 A1 Jul. 17, 2003

(30) Foreign Application Priority Data

Jun. 27, 2001 (AT) ................................ 1003/2001

(51) Int. Cl.
*H01R 12/00* (2006.01)
*H05K 1/00* (2006.01)
*G02B 6/44* (2006.01)

(52) U.S. Cl. ........................ 439/67; 439/501; 439/502; 385/114

(58) Field of Classification Search ................ 439/501, 439/67, 502
See application file for complete search history.

(56) References Cited

U.S. PATENT DOCUMENTS

| | | | | |
|---|---|---|---|---|
| 3,836,138 | A * | 9/1974 | Klepper et al. | 270/79 |
| 3,950,213 | A * | 4/1976 | Rejeski et al. | 156/461 |
| 4,034,658 | A * | 7/1977 | Sherman | 93/49 |
| 5,478,243 | A * | 12/1995 | Hopkins et al. | 439/35 |

FOREIGN PATENT DOCUMENTS

| | | | |
|---|---|---|---|
| DE | 3405126 | * | 8/1985 |

* cited by examiner

*Primary Examiner*—Chandrika Prasad
(74) *Attorney, Agent, or Firm*—Merchant & Gould

(57) ABSTRACT

The invention relates to a tension-relief attachment for multiple cables, especially flat-ribbon cables, having a bearing wall (11) which is provided with parallel bearing troughs (15), and having an abutment part (3) which presses the cable wires (19) against the bearing troughs (15) of the bearing wall (11). A base plate (5) is provided out of whose top the bearing wall (11) projects upwards, the bearing troughs, which are in the form of shells, being seated on the top (9) of the base plate (5) and extending from there to the upper edge (17) of the bearing wall (11). Furthermore, an abutment wall (27) is provided which can be pressed against the bearing wall (11) and is provided with bearing troughs (29) which are in mirror-image form and are in the form of shells, each of which is allocated to a bearing trough (15) of the bearing wall (11). Arranged in the base plate (5) are perforations which extend in the direction of the clamping channels which are each formed by two bearing troughs (15) in the form of shells.

3 Claims, 3 Drawing Sheets

CARRIER FOR PRODUCTION OF CABLE HARNESSES

The invention concerns a carrier for the production, and optionally the transport, of cable harnesses or parts of cable harnesses that are formed at least partially from ribbon cables Cable harnesses, especially in the automotive industry, because of the high percentage of manual labor both in production and incorporation, are now intense objects of study, in which an attempt is being made to find solutions that permit cable harnesses to be produced in a more automated manner than previously.

In the prior art, cable harnesses have been produced by hand on so-called plug tables, also simply called tables, in which cables are successively built-up by appropriately trained employees with the correct position and generally the correct connectors to ultimately be used in the vehicle and attached to each other with different clamps, mounts, or the like in the proper position. Finally, the finished cable harness (or also a part of the cable harness, a distinction which will no longer be made below) is tested and folded together or rolled up for transport to the plant, in which it is incorporated in a vehicle.

In a first step to facilitate automatic production, ribbon cables for some time have been used instead of the previously used common round cables, in which thus far only parts of cable harnesses have been replaced by such structures; for example, the cabling of a driver's door (control of the outside mirror, warning light in the door when the door is open, operating element for the window levers and central lock, etc.) were constructed with this new technique. On the one hand, the ribbon cables are advantageous in assembly in the vehicle, because of their limited height perpendicular to the plane of the ribbon cable, and because of their rigidity in the plane of the cable, which facilitates automatic handling. To this, we can add that the individual conductors within the ribbon cable are found at precisely defined locations and not, as in twisted round cables, exclusively found by color coding.

Ribbon cables also have the advantage that they can be placed one on the other at an angle and, in this position, one or all of the conductors of one of the cables can be joined to corresponding conductors of the other cable by means of appropriate techniques, for example, welded. Thus, it is possible to create branches or the like without additional connectors, which on the one hand keeps the manufacturing costs low and, on the other hand, keeps the design height small.

It has now been shown that the increasingly automated manipulation of such ribbon cables, during the production of cable harnesses that consist at least partially of such ribbon cables, poses a variety of problems on the ordinary table on which such cable harnesses are produced, since it is necessary or at least favorable that the different automatic manipulation machines have access to the ribbon cables lying on the table not only from the top, but also from the side or bottom. The interim solution, conducted in the laboratory by cutting out holes in the table to create a suitable access, is not a solution on an industrial scale because of the lack of flexibility of this process.

The objective of the invention is to create a device (carrier) on which cable harnesses that consist at least partly of ribbon cables can be produced and, in a preferred variant, a device that is also supposed to be capable of carrying out ordinary folding at the end of production of the cable harness or after some manufacturing steps of the cable harness for further transport.

The mentioned objects are achieved according to the invention in that the carrier is constructed from elongated profiles preferably joined releasably to each other, so that these profiles have a top on which the ribbon cables come to lie during their connection into a cable harness, and that a T-groove or other undercut groove is provided in one of the other sides of the profile.

With such a system, the surfaces on which ribbon cables come to lie in the finished state of the cable harness can be devised with simple connection elements quickly, easily, and flexibly. Because of the at least one groove present in the profile and not covered by the ribbon cable, it is possible in a simple manner to fasten connection elements or functional elements, such as pneumatic cylinders, clamping devices, holding devices, magnetic valves, pneumatic or electrical couplings, guide elements, mounts for connectors, etc., at the necessary sites.

In one embodiment of the invention, through which folding of the cable harness is made possible, a folding device is provided at at least one site of the carrier, through which folding of the cable harness after production occurs without a significant or harmful mechanical tensile or compressive load of the ribbon cables of the cable harness passing through the folding area.

This folding device moves the two parts of the carrier participating in folding along an evolvent (folding line) relative to each other, so that tension- and compression-free folding of the cable harness occurs, while maintaining a spacing between the two parts of the folded cable harness in the folded state.

In a preferred variant of this folding device, it consists of three gears, two of which are arranged coaxial and are connected to rotate in unison, in which the two rotational axes of the gears are fastened to a rocker that is mounted fixed on an axis between the two gears and two racks, the first of which cooperates with one of the two coaxially mounted gears and the second of which meshes with the two other gears that are situated on different axes. The first of the two racks is fixed with reference to the part of the carrier that does not move. The actual drive for the folding device can act on one of these elements or on the moving part of the carrier.

The invention is further explained below with reference to the drawings. In the drawings.

Figure 1:
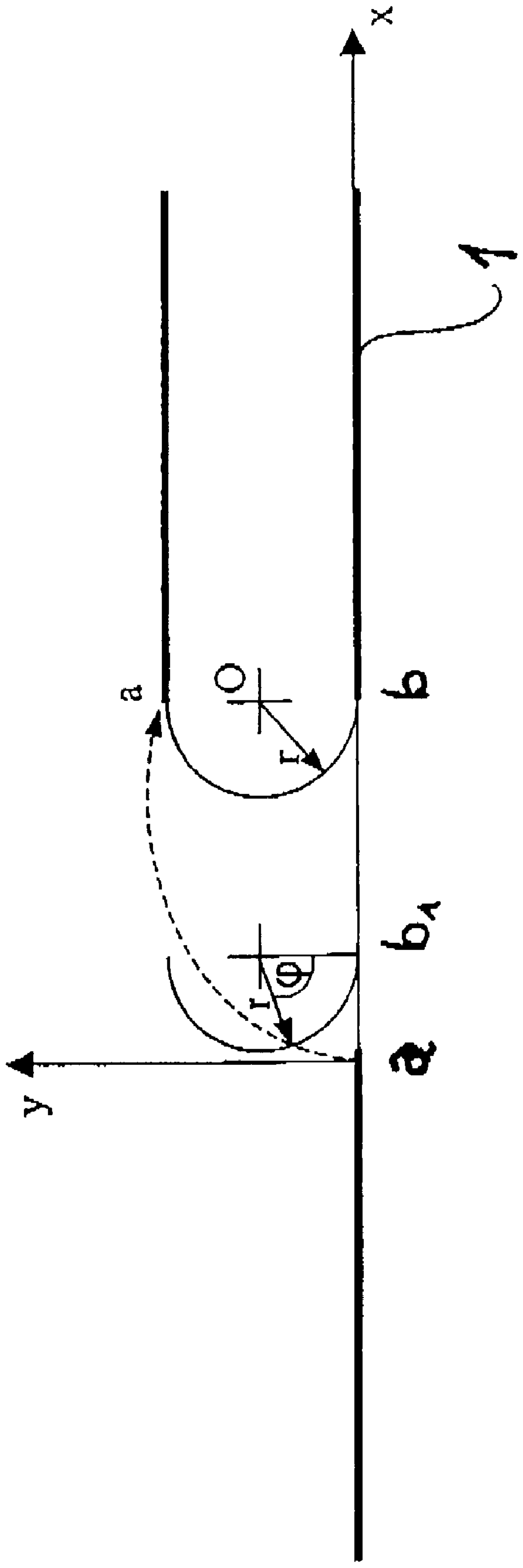
FIG. 1 shows the principle of folding.

FIG. 1 shows a theoretically ideal fold of a carrier 1, in which the "neutral line " (imaginable as an infinitely thin imaginary cable harness) is not exposed to either tension or compression during the entire folding process. The parts (a, b) of the cable harness that are considered undeformed are shown with thick lines, whereas the part (b1) of the cable harness 1 that is bent during folding is depicted with a thin line.

Figure 3:
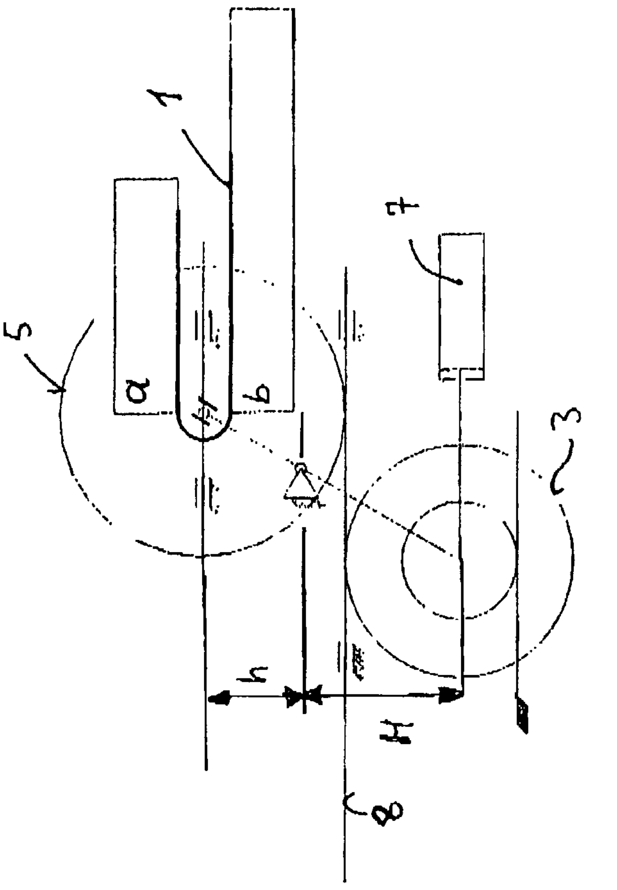
FIG. 3 shows the device of FIG. 2 in the folded state.
Figure 2:
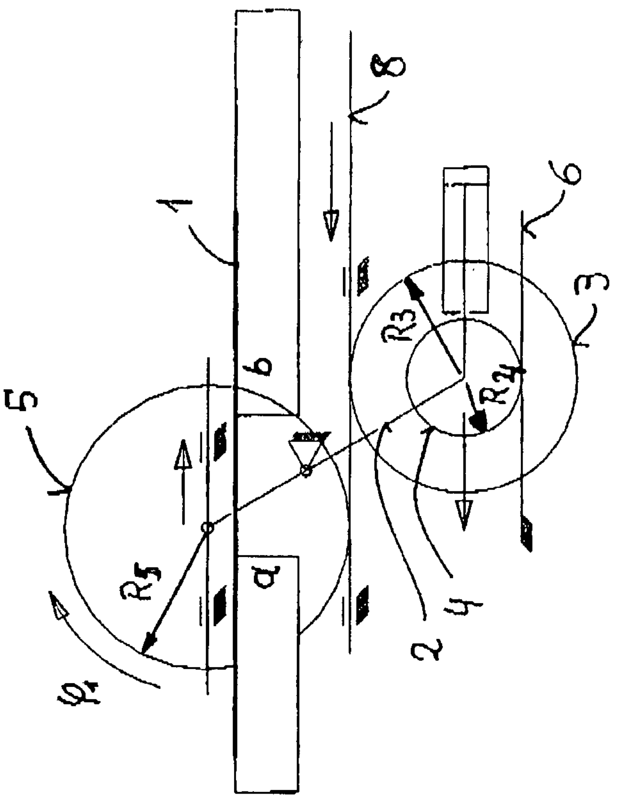
FIG. 2 shows a schematic view of a folding device according to the invention in the unfolded state.

FIGS. 2 and 3 show a device consisting of the aforementioned gears and racks, through which the theoretically ideal folding according to the invention shown in FIG. 1 can be achieved. A rocker 2, rotatable about a fixed bearing, carries two gears on one end, connected to rotate in unison with each other, coaxial gears 3, 4 and, on the other end, a gear 5. The gear 4 meshes, with a fixed rack 6, gears 3 and 5 with a two-sided rack 8 that can be moved parallel to the first rack 6. Gear 5 carries the moving part (a) of the carrier. During movement of the bearing of gears 3, 4, for example, by means of a cylinder-piston unit 7, the position shown in FIG. 3 is reached without the cable harness 1 being compressed or stretched. In FIGS. 2 and 3, the moving part and the fixed part of the carrier are designated by the respective indicia (a, b) that identify the corresponding parts of the cable harness in FIG. 1.

Figure 4:
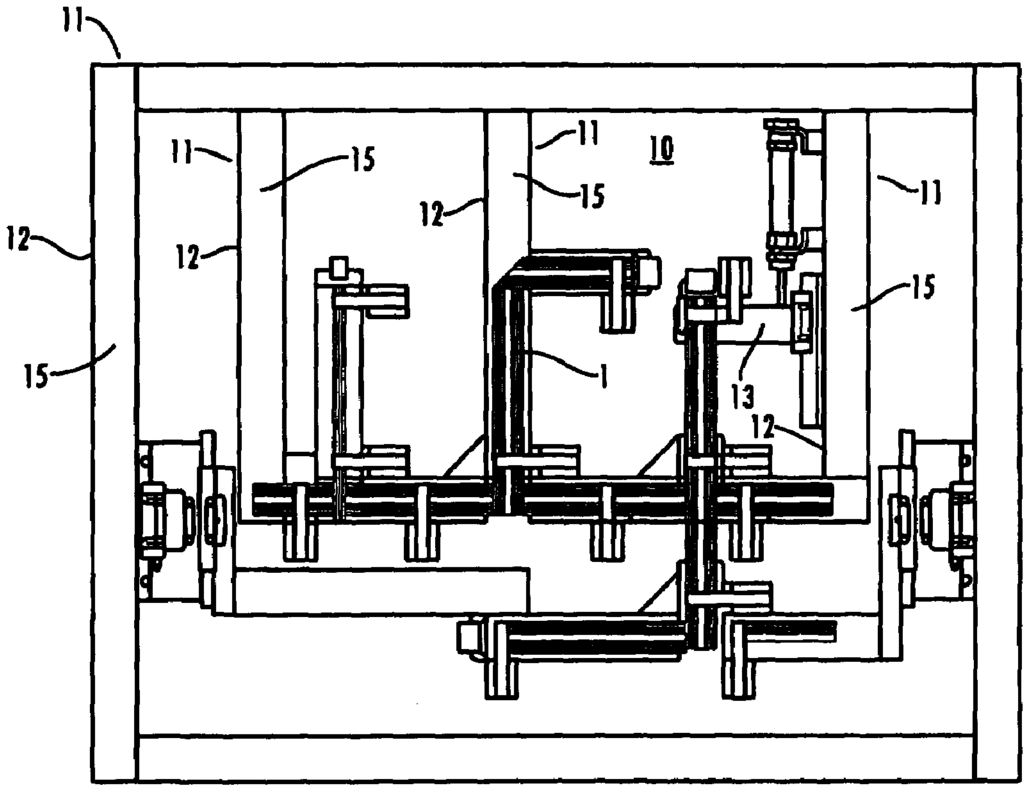
FIG. 4 shows a top view of a carrier according to the invention.
Figure 5:
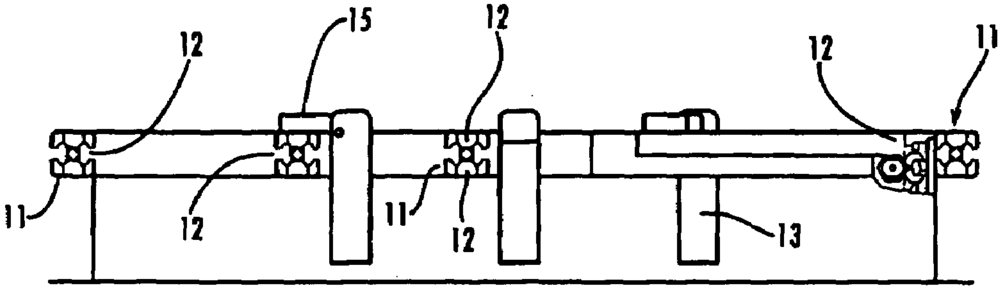
FIG. 5 shows a side view of a carrier according to the invention.

FIG. 4 shows, in a top view and side view, using a carrier 10 as an example, a profile 11 that is suitable for constructing a carrier according to the invention, in which not only one but four longitudinal grooves 12 are provided in an essentially square base element. For this reason, during layout of the carrier, the orientation of the profile need not be considered, and all types of devices 13 that are required to produce the cable harness from one or more ribbon cables can be fastened in four mutually orthogonal angular positions on each of the profiles, so that layout of the devices is significantly simplified. It does not entail the drawback that the ribbon cable rests on a side of the profile 11 provided with a longitudinal groove 12. This groove can be T-shaped or have a dovetail cross section.

For illustration, as examples of devices 13, folding devices for the ribbon cable, holding devices for the already formed folds, cylinder-piston units for movement of the devices, etc., are shown.

It is naturally possible to achieve foldability of the carrier in another way. Particularly in carriers that are used only to produce cable harnesses, but not for their transport, a costly system can be used, in which the two parts being folded are guided relative to each other by means of a pneumatically or electrically operated EDP device. In this case, the cable harness is preferably folded via a transport carrier that imparts to it the rigidity necessary for transport.

It is obvious to one skilled in the art, according to the above comments, that multiple folds are also possible, which, in principle, changes nothing relative to the devices and expedients according to the invention necessary and sufficient for this. It is naturally also possible, instead of or in addition to one or more "main folds", as described above, to fold one or more peripheral parts of the cable harness, optionally also about different axes, into the center, in order to arrive at transportable structures.

Both metals and plastics are considered as material for the carrier and they need only exhibit the necessary mechanical strength. Fastening of the devices 13 to the individual profiles 11 preferably occurs by clamping, but it is also conceivable that the profiles have recesses or openings on at least one of their sides at a periodic spacing, so that shape-matched assembly is possible.

The invention claimed is:

1. A carrier for supporting and folding a length of ribbon cable, the carrier comprising:

a first carrier part for supporting a first extent of a ribbon cable being folded and a second carrier part for supporting a second extent of the ribbon cable, the first and second carrier parts being separated by a folding area through which the ribbon cable extends; and a folding device supporting the first carrier part for selectable movement, relative to the second carrier part, along a folding line from a nonfolded position to a folded position whereat the first and second carrier parts overlay each other with a predetermined spacing between the carrier parts so as to fold the ribbon cable to the folded position, the movement by the folding device causing the folding area to curve along the folding line to the folding position without applying substantial tensile or compressive load to the ribbon cable at the folding area.

2. Carrier according to claim 1, characterized by the fact that:

the folding device comprises three gears having rotational axes, two of which gears are connected coaxially and rotate in unison with each other and the third of which rotates on a separate axis and moves the first carrier part relative to the second carrier part;

the two rotational axes of the gears are fastened to a rocker that is mounted in a fixed state with reference to one of the two parts of the carrier, on a rotational axis between the two coaxially connected gears and the third gear; and the folding device has two racks, the first of which cooperates with one of the two coaxially connected gears, and the second of which meshes simultaneously with the other of the two coaxially connected gears and with the third gear that rotates on a separate axis, with the first rack being fixed relative to the part of the carrier which is fixed relative to the rotational axis of the rocker and with the second rack being movable relative to the first rack, so that movement of the rocker on its rotational axis rotates the two coaxially connected gears by cooperation with the fixed first rack and causes the second of the coaxially connected gears to move the second rack, which in turn rotates the third gear as the rocker moves the rotational axis of the third gear, whereby the third gear moves the first carrier part along an evolvent path that causes the folding area to curve along the folding line to the folding position without applying substantial tensile or compressive load to the ribbon cable at the folding area.

3. The carrier as in claim 1, wherein:

the folding device moves the first carrier part to follow an evolvent path relative to the second carrier part.

* * * * *